United States Patent
Shin

(10) Patent No.: US 9,437,126 B2
(45) Date of Patent: Sep. 6, 2016

(54) TEST APPARATUS OF DISPLAY, METHOD AND COMPUTER READABLE MEDIUM

(71) Applicant: Woo-Jung Shin, Yongin (KR)

(72) Inventor: Woo-Jung Shin, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 701 days.

(21) Appl. No.: 13/923,691

(22) Filed: Jun. 21, 2013

(65) Prior Publication Data

US 2014/0244194 A1 Aug. 28, 2014

(30) Foreign Application Priority Data

Feb. 27, 2013 (KR) .................. 10-2013-0021525

(51) Int. Cl.
*G01R 19/00* (2006.01)
*G09G 3/30* (2006.01)
*G09G 3/00* (2006.01)
*G01R 31/30* (2006.01)
*G01R 31/36* (2006.01)
*G09G 3/32* (2016.01)

(52) U.S. Cl.
CPC .......... *G09G 3/006* (2013.01); *G01R 31/3004* (2013.01); *G01R 31/3624* (2013.01); *G09G 3/3233* (2013.01)

(58) Field of Classification Search
CPC ............ G09G 3/3233; G09G 3/3291; G09G 2300/0417; G09G 2300/0842; G09G 2320/0233; G09G 2320/029

USPC ......... 702/57, 64, 65; 349/108, 110; 345/77, 345/81
See application file for complete search history.

(56) References Cited

U.S. PATENT DOCUMENTS

| | | | | |
|---|---|---|---|---|
| 7,616,177 | B2 * | 11/2009 | Peng | G09G 3/3233 345/76 |
| 8,044,984 | B2 * | 10/2011 | Hsu | G09G 3/2014 315/169.3 |
| 8,477,087 | B2 * | 7/2013 | Yamamoto | G09G 3/3233 345/76 |
| 8,704,737 | B1 * | 4/2014 | Fan | G09G 3/32 315/169.3 |

FOREIGN PATENT DOCUMENTS

| KR | 10-2009-0045404 A | 5/2009 |
|---|---|---|
| KR | 10-2010-0038394 A | 4/2010 |
| KR | 10-2012-0104783 A | 9/2012 |

* cited by examiner

*Primary Examiner* — An Do
(74) *Attorney, Agent, or Firm* — Lee & Morse, P.C.

(57) ABSTRACT

A test apparatus for a display includes an interface transmitting characteristic information including a resolution of the display unit and each equivalent model of a plurality of pixels, a reference voltage model including a plurality of reference voltages respectively corresponding to a plurality of pixels included in a unit region of the display unit, and pixel information including a position of a plurality of pixels to be tested among a plurality of pixels, a pixel model generator that schematizes a plurality of pixels into a plurality of test pixels and at least one equivalent load pixel according to the characteristic information and the pixel information to generate a pixel model, and a voltage mapper that maps the reference voltage model to the pixel model to calculate test voltages respectively corresponding to a plurality of test pixels and the equivalent load pixel.

17 Claims, 5 Drawing Sheets

FIG. 4

| PX_T11 | EPX_L11 | EPX_L12 | EPX_L13 | EPX_L14 | PX_T12 | EPX_L15 | EPX_L16 | EPX_L17 | EPX_L18 | PX_T13 |
| --- | --- | --- | --- | --- | --- | --- | --- | --- | --- | --- |
| PX_T21 | EPX_L21 | EPX_L22 | EPX_L23 | EPX_L24 | PX_T22 | EPX_L25 | EPX_L26 | EPX_L27 | EPX_L28 | PX_T23 |
| PX_T31 | EPX_L31 | EPX_L32 | EPX_L33 | EPX_L34 | PX_T32 | EPX_L35 | EPX_L36 | EPX_L37 | EPX_L38 | PX_T33 |

FIG. 5

| V1 | V2 | V3 | V4 | V5 | V6 | V7 | V8 | V9 | V10 | V11 | V12 | V13 | V14 | V15 | V16 | V17 | V18 | V19 | V20 |
|---|---|---|---|---|---|---|---|---|---|---|---|---|---|---|---|---|---|---|---|
| V21 | V22 | V23 | V24 | V25 | V26 | V27 | V28 | V29 | V30 | V31 | V32 | V33 | V34 | V35 | V36 | V37 | V38 | V39 | V40 |
| V41 | V42 | V43 | V44 | V45 | V46 | V47 | V48 | V49 | V50 | V51 | V52 | V53 | V54 | V55 | V56 | V57 | V58 | V59 | V60 |

TEST APPARATUS OF DISPLAY, METHOD AND COMPUTER READABLE MEDIUM

CROSS-REFERENCE TO RELATED APPLICATION

This application claims priority to and the benefit of Korean Patent Application No. 10-2013-0021525 filed in the Korean Intellectual Property Office on Feb. 27, 2013, the entire contents of which are incorporated herein by reference.

BACKGROUND

1. Field

Embodiments relate to a test apparatus of a display device, a method thereof, and a computer readable medium. More particularly, the embodiments relate to a test apparatus and a method thereof of an organic light emitting diode (OLED) display.

2. Description of the Related Art

In a display device, a plurality of pixels are disposed in a matrix form on a substrate so as to be used as a display area, scan lines and data lines are connected to pixels, and data signals are selectively applied to the pixels to display an image.

Currently, display devices are divided into a passive matrix type of light emitting display device and an active matrix type of light emitting display device depending on how pixels are driven. The active matrix type of light emitting display device, in which unit pixels are selectively turned on, is becoming dominant due to its higher resolution, contrast, and operation speed.

Such active matrix display devices serve as displays of mobile information terminals, e.g., a personal computer, a mobile phone, a personal digital assistant (PDA), and the like, or as a monitor of various information devices. A liquid crystal display (LCD) using a liquid crystal panel, an organic light emitting diode (OLED) display device using an organic light emitting element, a plasma display panel (PDP), are all well-known examples of display devices. Among these, organic light emitting diode (OLED) displays, which have excellent luminous efficiency, luminance, and viewing angle, and a fast response speed, stand out.

The organic light emitting diode (OLED) display includes a plurality of pixels arranged in an approximate matrix. Each pixel includes an organic light emitting diode (OLED) and emits light according to a current flowing to the organic light emitting diode (OLED). The luminance of the organic light emitting diode (OLED) display is largely influenced by a power source voltage and a data voltage. However, when actually driving the organic light emitting diode (OLED) display, different power source voltages are applied according to positions of each pixel due to a coupling effect between metal wires or a voltage drop.

The above information disclosed in this Background section is only for enhancement of understanding and therefore it may contain information that does not form the prior art that is already known in this country to a person of ordinary skill in the art.

SUMMARY

One or more embodiments are directed to a test apparatus of a display device including a display unit including a plurality of pixels and a power source voltage application line respectively connected to a plurality of pixels and applying a power source voltage, test apparatus including: an interface unit transmitting characteristic information including a resolution of the display unit and each equivalent model of a plurality of pixels, a reference voltage model including a plurality of reference voltages respectively corresponding to a plurality of pixels included in a unit region of the display unit, and pixel information including a position of a plurality of pixels to be tested among a plurality of pixels; a pixel model generator schematizing a plurality of pixels into a plurality of test pixels and at least one equivalent load pixel according to the characteristic information and the pixel information to generate a pixel model; and a voltage mapper mapping the reference voltage model to the pixel model to calculate test voltages respectively corresponding to a plurality of test pixels and the equivalent load pixel.

The reference voltage may be a predicted value of the power source voltage to be respectively applied to a plurality of pixels of the unit region by using the voltage drop of the power source voltage application line according to each position of a plurality of pixels.

The pixel model generator may schematize the equivalent load pixel by using the equivalent model of a plurality of pixels positioned between at least two test pixels among a plurality of test pixels and arrange a plurality of test pixels and equivalent load pixels with a matrix according to each position to generate the pixel model.

The voltage mapper calculates a mapping coefficient d according to Equation 1:

$$d=(j-1)/(p-1) \qquad [\text{Equation 1}]$$

where p is a number of the test pixels included in one row of the pixel model, and j is a number of a column of the reference voltage model.

The voltage mapper calculates a sequential order m of the reference voltage corresponding to the test pixel according to Equation 2:

$$m=d\times(x-1)+1 \qquad [\text{Equation 2}]$$

where x is a sequential order of the test pixel positioned at a y-th row of the pixel model.

The voltage mapper may map the reference voltage of the calculated sequential order to the test pixel. The voltage mapper may calculate the average value of a plurality of reference voltages arranged between the reference voltages of the sequential orders respectively corresponding to a plurality of test pixels as the test voltage of a plurality of equivalent load pixels.

A determining unit applying the test voltage as each power source voltage of a plurality of test pixels and the equivalent load pixels for simulation driving and determining a defect existence by calculating a luminance value corresponding to a current respectively flowing to a plurality of test pixels and the equivalent load pixels according to the simulation driving may be further included.

One or more embodiments are directed to a method of testing a display device including a display unit including a plurality of pixels and a power source voltage application line respectively connected to a plurality of pixels and applying a power source voltage, the method including: receiving characteristic information including a resolution of the display unit and each equivalent model of a plurality of pixels, a reference voltage model including a plurality of reference voltages respectively corresponding to a plurality of pixels included in a unit region of the display unit, and pixel information including a position of a plurality of pixels to be tested among a plurality of pixels; schematizing a plurality of pixels into a plurality of test pixels and at least one equivalent load pixel according to the characteristic information and the pixel information to generate a pixel model; and mapping the reference voltage model to the pixel model to calculate test voltages respectively corresponding to a plurality of test pixels and the equivalent load pixel.

Receiving the reference voltage may include calculating a predicted value of the power source voltage to be respectively applied to a plurality of pixels of the unit region by using the voltage drop of the power source voltage application line according to each position of a plurality of pixels as the reference voltage.

Generating the pixel model may include schematizing the equivalent load pixel by using the equivalent model of a plurality of pixels positioned between at least two test pixels among a plurality of test pixels and arranging a plurality of test pixels and equivalent load pixels with a matrix according to each position.

Mapping the reference voltage may include calculating a mapping coefficient d according to Equation 1:

$$d=(j-1)/(p-1) \quad \text{[Equation 1]}$$

where p is a number of the test pixels included in one row of the pixel model, and j is a number of a column of the reference voltage model.

Mapping the reference voltage may include calculating a sequential order m of the reference voltage corresponding to the test pixel according to Equation 2:

$$m=d\times(x-1)+1 \quad \text{[Equation 2]}$$

where, x is a sequential order of the test pixel positioned at a y-th row of the pixel model.

Calculating the test voltage may include mapping the reference voltage of the calculated sequential order to the test pixel. Calculating the test voltage may include calculating the average value of a plurality of reference voltages arranged between the reference voltages of the sequential orders respectively corresponding to a plurality of test pixels as the test voltage of a plurality of equivalent load pixels.

The method may further include applying the test voltage as each power source voltage of a plurality of test pixels and the equivalent load pixel for simulation driving, and determining a defect existence by calculating a luminance value corresponding to a current respectively flowing to a plurality of test pixels and the equivalent load pixels according to the simulation driving.

One or more embodiments are directed to a computer readable medium written with a program to perform the above-described test method of the display device.

BRIEF DESCRIPTION OF THE DRAWINGS

FIG. 4 is a view to explain a pixel model according to an exemplary embodiment.

FIG. 5 is a view to explain a reference voltage model according to an exemplary embodiment.

DETAILED DESCRIPTION

Figure 1:
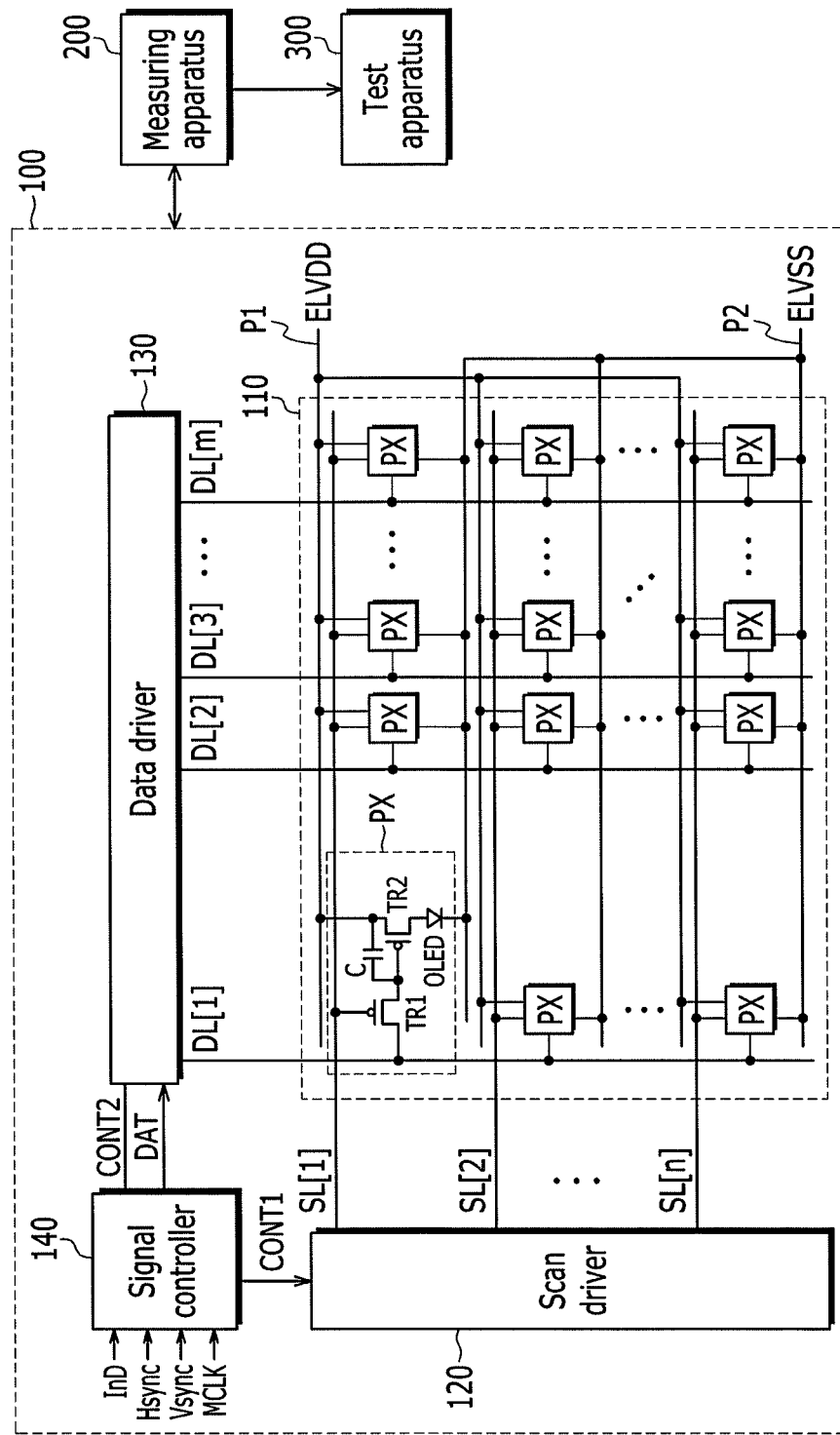
FIG. 1 is a view of a test system of a display device according to an exemplary embodiment.

In the following detailed description, only certain exemplary embodiments have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 is a view of a test system of a display device according to an exemplary embodiment. Referring to FIG. 1, a test system 1 according to an exemplary embodiment includes an organic light emitting diode (OLED) display 100, a measuring apparatus 200, and a test apparatus 300. The organic light emitting diode (OLED) display 100 includes a display unit 110, a scan driver 120, a data driver 130, and a signal controller 140. The display unit 110 is a display area including a plurality of pixels PX, and a plurality of scan lines SL[1]-SL[n] and a plurality of data lines DL[1]-DL[m].

A first driving voltage (VDD) application line P1 and a second driving voltage (VSS) application line P2 may be formed in the display unit 110. In the particular non-limiting example illustrated in FIG. 1, each pixel PX respectively includes a switching transistor TR1, a driving transistor TR2, a capacitor C, and an organic light emitting diode (OLED). The switching transistor TR1 includes the gate electrode connected to a scan line SL[1], the source electrode connected to a data line DL[1], and the drain electrode connected to the gate electrode of the driving transistor TR2.

The driving transistor TR2 includes the source electrode connected to a first power source voltage (ELVDD) application line P1, the drain electrode connected to the anode of the organic light emitting diode (OLED), and the gate electrode transmitted with the data signal Data1 during a period in which the switching transistor TR1 is turned on.

The capacitor C is connected to the gate electrode and the source electrode of the driving transistor TR2. The cathode of the organic light emitting diode (OLED) is connected to the second power source voltage (ELVSS) application line P2.

In the pixel PX having these constitutions, if the switching transistor TR1 is turned on by the scan signal S[1], the data signal Data1 is transmitted to the gate electrode of the driving transistor TR2. The voltage difference between the gate electrode and the source electrode of the driving transistor TR2 is maintained by the capacitor C and the driving current flows to the driving transistor TR2. The organic light emitting diode (OLED) emits light according to the driving current.

The scan driver 120 generates and transmits a plurality of scan signals S[1]-S[n] according to the first driving control signal CONT1 to the corresponding scan lines. The data driver 130 processes image data R, G, and B according to the second driving control signal CONT2 to be suitable for a characteristic of the display unit 110 to generate a plurality of data signals D[1]-D[m].

The signal controller 140 receives external input data InD and a synchronization signal, and generates the first driving control signal CONT1, the second driving control signal CONT2, and the image data R, G, and B. The synchronization signal includes a horizontal synchronization signal Hsync, a vertical synchronization signal Vsync, and a main clock signal MCLK.

The measuring apparatus 200 generates the characteristic information of the display device 100 and a reference voltage model. The characteristic information may include a resolution of the display device 100, each equivalent model of a plurality of pixels PX, and the values of the first and second power source voltages ELVDD and ELVSS.

For example, the measuring apparatus 200 may convert the switching transistor TR1, the driving transistor TR2, and the organic light emitting diode (OLED) respectively included in a plurality of pixels PX into equivalent resistance values, and may generate an equivalent model having a resistor having the converted equivalent resistance value and the capacitor C.

The measuring apparatus 200 may divide the region of the display unit 110 into a plurality of regions having a predetermined size, and may extract at least one among the plurality of regions as a unit region. The measuring apparatus 200 calculates a voltage drop IR for each position by using each equivalent model of the plurality of pixels PX included in the extracted unit region.

That is, a deviation of the first power source voltage ELVDD respectively supplied to a plurality of pixels PX is calculated by considering a voltage drop for each position generated corresponding to a distance from a power source terminal supplying the first power source voltage ELVDD to the first power source voltage application line P1 and a coupling capacitance between adjacent first power source voltage application lines P1. The deviation of the second power source voltage ELVSS may be calculated.

The measuring apparatus 200 calculates a plurality of reference voltages for a plurality of pixels PX included in the unit region according to the voltage drop. That is, the reference voltages have the values predicting the first and/or the second power source voltages ELVDD and ELVSS to be respectively transmitted to a plurality of pixels PX by considering the voltage drop according to each position of a plurality of pixels PX in the first and second power source voltages ELVDD and ELVSS applied when actually driving the display device 100.

The measuring apparatus 200 generates the reference voltages for the positions of each pixel PX into the reference voltage model corresponding to the display device 100. The reference voltage model may consist of a table generated by arranging the reference voltages in i rows and j columns corresponding to each position of a plurality of pixels PX included in the unit region.

The test apparatus 300 receives the characteristic information and the reference voltage model of the display device 100 from the measuring apparatus 200, receives the pixel information to be tested from a user to generate the pixel model, and maps the reference voltage model to the generated pixel model to calculate a plurality of test voltages. The pixel information includes a number and a position of the pixel selected for the test among a plurality of pixels PX of the display device 100. Hereafter, the pixel to be tested is referred to as a test pixel PX_T, and the rest of the pixels excluding for the test pixel are referred to as load pixels PX_L.

Figure 2:
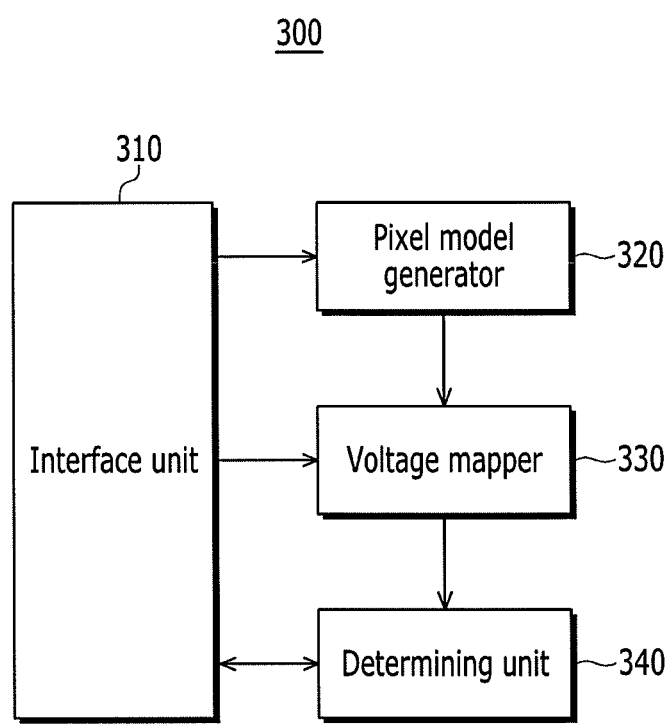
FIG. 2 is a detailed block diagram of the test apparatus 300 shown in FIG. 1.

FIG. 2 is a detailed block diagram of the test apparatus 300 shown in FIG. 1. Referring to FIG. 2, the test apparatus 300 according to an exemplary embodiment includes an interface unit 310, a pixel model generator 320, a voltage mapper 330, and a determining unit 340. The interface unit 310 receives the characteristic information and the reference voltage model of the display device 100 from the measuring device 200, and receives the pixel information to be tested from the user. The interface unit 310 may include a PC (personal computer), a laptop, a mouse, a keyboard, and so forth.

The pixel model generator 320 schematizes the display unit 110 according to the characteristic information and the pixel information of the display device 100 to generate the pixel model corresponding to the position of a plurality of test pixels PX_T. In detail, the pixel model generator 320 schematizes a plurality of load pixels PX_L positioned between a plurality of test pixels PX_T as at least one equivalent load pixel EPX_L.

The pixel model generator 320 may schematize the equivalent load pixel EPX_L as an equivalent resistance that is summed according to a number of a plurality of load pixels PX_L by using each equivalent model of a plurality of pixels PX. That is, the pixel model generator 320 may schematize the entire pixels PX of the display unit 110 into the test pixel PX_T and the equivalent load pixel EPX_L, and may respectively arrange the test pixel PX_T and the equivalent load pixel EPX_L according to the position to generate the pixel model.

The pixel model may be a table generated by arranging a plurality of test pixels PX_T and equivalent load pixels EPX_L with k number of rows and s number of columns. In an exemplary embodiment, a case of testing a defect for a horizontal direction of the display unit 110 will be described. A number y of the entire rows of the pixel models may be set to be the same as a number i of the reference voltage models.

The voltage mapper 330 maps the reference voltage model to the generated pixel model to calculate the test voltages respectively corresponding to a plurality of test pixels PX_T and equivalent load pixels EPX_L included in the pixel model. The test voltage may be the first and/or the second power source voltages ELVDD and ELVSS respectively applied to a plurality of test pixels PX_T and equivalent load pixels EPX_L.

The determining unit 340 simulates and drives a plurality of test pixels PX_T and equivalent load pixels EPX_L by using the test voltage calculated from the voltage mapper 330 to determine defect existence of the test pixel PX_T according to the simulation result. For example, the determining unit 340 may convert the current value detected by respectively applying the test voltage to a plurality of test pixels PX_T and equivalent load pixels EPX_L for the simulation driving into the luminance value, and may that determine the display device has a possibility of a spot being generated according to the deviation of the luminance value between a plurality of test pixels PX_T disposed in at least one column.

Figure 3:
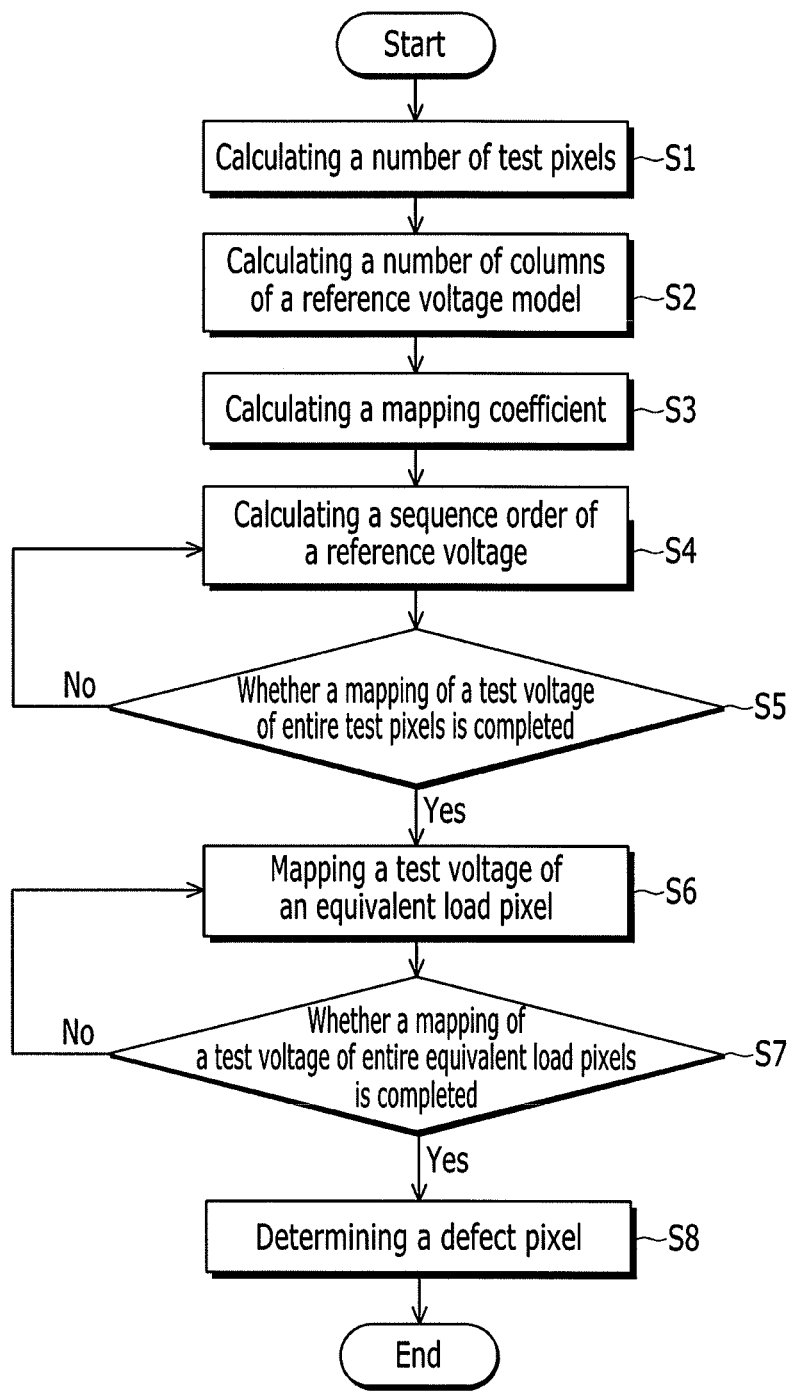
FIG. 3 is a flowchart to explain a test method of a display device according to an exemplary embodiment.

FIG. 3 is a flowchart to explain a test method of a display device according to an exemplary embodiment. Referring to FIG. 3, firstly, the test pixel PX_T among a plurality of pixels PX of the display device 100 to be tested is selected. In an exemplary embodiment, the region of the display unit 110 is divided into an upper region, a middle region, and a lower region, and three test pixels PX_T positioned at a predetermined row for each region are selected.

As shown in FIG. 4, the pixel model generator 320 may schematize the test pixels PX_T11-PX_T13 selected in the upper region and sequentially arrange them in the first row, and may schematize a plurality of load pixels PX_L positioned between the first test pixel PX_T11 and the second test pixel PX_T12 in a column direction into four equivalent load pixels EPX_L11-EPX_L14 and sequentially arrange them. Also, a plurality of load pixels PX_L disposed between the second test pixel PX_T12 and the third test pixel PX_T13 in the column direction may be schematized into the equivalent load pixels EPX_L15-EPX_L18 and sequentially arranged.

Likewise, the pixel model generator 320 may schematize the test pixels PX_T21-PX_T23 selected in the middle region and arranges them in the second row and the load pixel PX_L positioned between the test pixels PX_T21-PX_T23 into the equivalent load pixels EPX_L21-EPX_L28 and sequentially arranges them. The pixel model generator 320 may schematize the test pixels PX_T21-PX_T23 and the equivalent load pixels EPX_L21-EPX_L28 by reflecting the voltage drop corresponding to the distance in the row direction compared with the test pixels PX _T11-PX_T13 and the equivalent load pixels EPX_L11-EPX_L18. Through this method, the pixel model generator 320 generates the pixel model.

Next, the voltage mapper 330 may count a number of the test pixels PX_T included in one row of the pixel model (S1). Then, the voltage mapper 330 counts a number of reference voltages included in one row of the reference voltage model, i.e., a number of columns of the reference voltage models (S2).

As shown in FIG. 5, the voltage mapper 330 may receive the reference voltage model including 20 columns and 3 rows corresponding to 20*3 unit regions. That is, the reference voltage model includes a value of the reference voltage V1 corresponding to the pixel PX positioned at the first column of the first row of the unit region, a value of the reference voltage V2 corresponding to the pixel PX positioned at the second column of the first row, and a value of the reference voltage V21 corresponding to the pixel PX positioned at the first column of the second row.

Next, the voltage mapper 330 calculates a mapping coefficient d by using Equation 1 (S3). Here, p is a number of test pixels PX_T included in one row of the pixel model, and j is a number of columns of the reference voltage model.

$$d=(j-1)/(p-1) \quad \text{(Equation 1)}$$

For example, in the case of the pixel model shown in FIG. 4, p is 3, and in the case of the reference voltage model shown in FIG. 5, j is 20. Accordingly, the mapping coefficient d is calculated as 9.5.

Next, the voltage mapper 330 calculates a sequential order m of the reference voltage corresponding to the test pixel PX_Tyx of the x-th sequential order of the y-th row of the pixel model by using Equation 2 (S4).

$$m=d\times(x-1)+1 \quad \text{(Equation 2)}$$

For example, the test pixel PX_T11 of the first sequential order of the first row of the pixel model shown in FIG. 4 corresponds the reference voltage V1 of the first sequential order of the first row of the reference voltage model, and the test pixel PX_T12 of the second sequential order of the first row corresponds to the reference voltage V11 of the 11-th sequential order. The voltage mapper 330 may round off m that is calculated in Equation 2 to be calculated into the sequential order of the reference voltage.

The test pixel PX_T13 of the third sequential order of the first row corresponds to the reference voltage V20 of the 20-th sequential order. Likewise, the test pixel PX_T21 of the first sequential order of the second row of the pixel model corresponds to the reference voltage V21 of the first sequential order of the second row of the reference voltage model.

In this way, the voltage mapper 330 determines whether the sequential order m of the reference voltage corresponding to the test pixel PX_Tyx of the x-th sequential order of the y-th row of the pixel model is fully calculated (S5), and maps the reference voltage of the sequential order corresponding to the corresponding test pixel as the test voltage in the case that they are all calculated.

Next, the voltage mapper 330 maps the average value of the reference voltage arranged between the reference voltages of the sequential orders respectively corresponding to the test pixel PX_Tyx and the test pixel PX_Ty,x+1 to the equivalent load pixel EPX_L positioned between the test pixel PX_Tyx of the x-th sequential order of the y-th row and the test pixel PX_Ty,x+1 of the x+1-th sequential order of the y-th row as the test voltage (S6).

The voltage mapper 330 may calculate an average by selecting a portion among the reference voltages arranged between the reference voltages of the sequential orders respectively corresponding to the test pixel PX_Tyx and the test pixel PX_Ty,x+1 according to a number of the equivalent load pixel EPX_L between the test pixel PX_Tyx and the test pixel PX_Ty,x+1.

For example, when the four equivalent load pixels EPX_L11-EPX_L14 are between the test pixel PX_T11 and the test pixel PX_T12 of the pixel model of FIG. 4 and the ten reference voltages V2-V10 are between the reference voltage V1 corresponding to the test pixel PX_T11 and the reference voltage V11 corresponding to the test pixel PX_T12, the average value of the reference voltages V2 and V3 in the equivalent load pixel EPX_L11, the average value of the reference voltages V6 and V7 in the equivalent load pixel EPX_L12, the average value of the reference voltages V4 and V5 in the equivalent load pixel EPX_L13, and the average value of the reference voltages V8-V10 in the equivalent load pixel EPX_L 14 may be calculated as the test voltage.

That is, in the equivalent load pixel EPX_L positioned between the test pixel PX_Tyx and the test pixel PX_Ty,x+1, the average of the rest reference voltages except for the reference voltages respectively corresponding to the test pixel PX_Tyx and the test pixel PX_Ty,x+1 is calculated as the test voltage and is arbitrary distributed to the equivalent load pixel EPX_L.

The average of the rest of the reference voltages may be divided by a number of the equivalent load pixels EPX_L positioned between the test pixel PX_Tyx and the test pixel PX_Ty,x+1, and may be distributed. For example, when one equivalent load pixel EPX_L is between the test pixel PX_Tyx and the test pixel PX_Ty,x+1 and the reference voltages are 3, the average of three reference voltages may be calculated as the test voltage in the corresponding equivalent load pixel EPX_L.

In this way, the voltage mapper 330 determines whether the test voltage is fully calculated in the equivalent load pixels EPX_L positioned between the test pixel PX_Tyx and the test pixel PX_Ty,x+1(S7), and maps the test voltage corresponding to the corresponding equivalent load pixel EPX_L. Accordingly, an exemplary embodiment automatically maps the reference voltage model to the pixel model according to the above-described sequence to calculate the test voltage such that time required for the data processing may be reduced and error generation may be prevented.

Next, the determining unit 340 applies the calculated test voltages to a plurality of test pixels PX_T and equivalent load pixels EPX_L for simulation driving. Then, a defective pixel may be detected according to the result of the simulation driving (S8). Accordingly, it may be confirmed whether the spot will be generated in the corresponding display panel 100 according to the determination result.

By way of summation and review, embodiments are directed to an apparatus and method that determines the existence of defects using a simulation before putting the product on the market. By considering a deviation of the power source voltage of the positions for each pixel, the simulation may approximate the behavior of the actual panel operation over its lifetime. In particular, one or more embodiment of the present invention relates to the test apparatus of the display device, embodiments are directed to an apparatus and method that automatically maps the deviation of the power source voltage for the position of each pixel such that the time for the data processing is reduced and the error generation may be prevented. Thus, defective panels may be efficiently discovered and prevented from being sold.

While embodiments have been described relative to a hardware implementation, the determination described above may be implemented in software, e.g., by an article of manufacture having a machine-accessible or non-transitory computer-readable medium including data that, when accessed by a machine, e.g., a processor, cause the machine to perform a method, according to one or more aspects of the invention, for generating a plurality of reference voltages. Non-transitory computer-readable media is to include all computer-readable media except for a transitory, propagating signal.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A test apparatus for a display device including a display unit including a plurality of pixels and a power source voltage application line respectively connected to a plurality of pixels and applying a power source voltage, the test apparatus comprising:
an interface transmitting a characteristic information including resolution of the display unit and each equivalent model of a plurality of pixels, a reference voltage model including a plurality of reference voltages respectively corresponding to a plurality of pixels included in a unit region of the display unit, and pixel information including a position of a plurality of pixels to be tested among the plurality of pixels;
a pixel model generator that schematizes the plurality of pixels into a plurality of test pixels and at least one equivalent load pixel according to the characteristic information and the pixel information to generate a pixel model; and
a voltage mapper that maps the reference voltage model to the pixel model to calculate test voltages respectively corresponding to the plurality of test pixels and the equivalent load pixel.

2. The test apparatus of claim 1, wherein:
the reference voltage is a predicted value of the power source voltage to be respectively applied to a plurality of pixels of the unit region using the voltage drop of the power source voltage application line according to each position of a plurality of pixels.

3. The test apparatus of claim 1, wherein:
the pixel model generator schematizes the equivalent load pixel using the equivalent model of a plurality of pixels positioned between at least two test pixels among a plurality of test pixels and arranges a plurality of test pixels and equivalent load pixels with a matrix according to each position to generate the pixel model.

4. The test apparatus of claim 1, wherein:
the voltage mapper calculates a mapping coefficient d according to Equation 1:

$$d=(j-1)/(p-1) \qquad \text{[Equation 1]}$$

where p is a number of the test pixels included in one row of the pixel model, and j is a number of a column of the reference voltage model.

5. The test apparatus of claim 4, wherein:
the voltage mapper calculates a sequential order m of the reference voltage corresponding to the test pixel according to Equation 2:

$$m=d\times(x-1)+1 \qquad \text{[Equation 2]}$$

where x is a sequential order of the test pixel positioned at a y-th row of the pixel model.

6. The test apparatus of claim 5, wherein:
the voltage mapper maps the reference voltage of the calculated sequential order to the test pixel.

7. The test apparatus of claim 6, wherein:
the voltage mapper calculates the average value of a plurality of reference voltages arranged between the reference voltages of the sequential orders respectively corresponding to a plurality of test pixels as the test voltage of a plurality of equivalent load pixels.

8. The test apparatus of claim 1, further comprising:
a determiner that applies the test voltage as each power source voltage of a plurality of test pixels and the equivalent load pixels for simulation driving and determines a defect existence by calculating a luminance value corresponding to a current respectively flowing to a plurality of test pixels and the equivalent load pixels according to the simulation driving.

9. A method of testing a display device including a display unit including a plurality of pixels and a power source voltage application line respectively connected to a plurality of pixels and applying a power source voltage, the method comprising:
receiving characteristic information including a resolution of the display unit and each equivalent model of a plurality of pixels, a reference voltage model including a plurality of reference voltages respectively corresponding to a plurality of pixels included in a unit region of the display unit, and pixel information including a position of a plurality of pixels to be tested among a plurality of pixels;
schematizing a plurality of pixels into a plurality of test pixels and at least one equivalent load pixel according to the characteristic information and the pixel information to generate a pixel model; and
mapping the reference voltage model to the pixel model to calculate test voltages respectively corresponding to a plurality of test pixels and the equivalent load pixel.

10. The method of claim 9, wherein receiving the reference voltage includes:
calculating a predicted value of the power source voltage to be respectively applied to a plurality of pixels of the unit region using the voltage drop of the power source voltage application line according to each position of a plurality of pixels as the reference voltage.

11. The method of claim 9, wherein generating the pixel model includes:

schematizing the equivalent load pixel by using the equivalent model of a plurality of pixels positioned between at least two test pixels among a plurality of test pixels and arranging a plurality of test pixels and equivalent load pixels with a matrix according to each position.

12. The method of claim 9, wherein mapping the reference voltage includes:

calculating a mapping coefficient d according to Equation 1:

$$d=(r-1)/(p-1) \quad \text{[Equation 1]}$$

where p is a number of the test pixels included in one row of the pixel model, and j is a number of a column of the reference voltage model.

13. The method of claim 12, wherein mapping the reference voltage includes:

calculating a sequential order m of the reference voltage corresponding to the test pixel according to Equation 2:

$$m=d\times(x-1)+1 \quad \text{[Equation 2]}$$

where x is a sequential order of the test pixel positioned at a y-th row of the pixel model.

14. The method of claim 13, wherein calculating the test voltage includes:

mapping the reference voltage of the calculated sequential order to the test pixel.

15. The method of claim 13, wherein calculating the test voltage includes:

calculating the average value of a plurality of reference voltages arranged between the reference voltages of the sequential orders respectively corresponding to a plurality of test pixels as the test voltage of a plurality of equivalent load pixels.

16. The method of claim 9, further comprising:

applying the test voltage as each power source voltage of a plurality of test pixels and the equivalent load pixels for a simulation driving; and determining a defect existence by calculating a luminance value corresponding to a current respectively flowing to a plurality of test pixels and the equivalent load pixels according to the simulation driving.

17. A tangible, non-transitory computer readable medium written with the program to perform the method of claim 9.

* * * * *